US009438257B1

(12) United States Patent
Perdoor et al.

(10) Patent No.: US 9,438,257 B1
(45) Date of Patent: Sep. 6, 2016

(54) PROGRAMMABLE FREQUENCY DIVIDER PROVIDING OUTPUT WITH REDUCED DUTY-CYCLE VARIATIONS OVER A RANGE OF DIVIDE RATIOS

(71) Applicant: Aura Semiconductor Pvt. Ltd, Bangalore (IN)

(72) Inventors: Sandeep Perdoor, Bangalore (IN); Vaibhav Maheshwari, Bangalore (IN); Augusto Marques, Bangalore (IN)

(73) Assignee: AURA SEMICONDUCTOR PVT. LTD, Bangalore (IN)

( * ) Notice: Subject to any disclaimer, the term of this patent is extended or adjusted under 35 U.S.C. 154(b) by 0 days.

(21) Appl. No.: 15/044,115

(22) Filed: Feb. 16, 2016

(30) Foreign Application Priority Data

Jul. 2, 2015  (IN) .......................... 3361/CHE/2015

(51) Int. Cl.
| H03K 21/00 | (2006.01) |
| H03L 7/197 | (2006.01) |
| H03K 21/02 | (2006.01) |
| H03K 21/38 | (2006.01) |
| H03L 7/089 | (2006.01) |
| H03L 7/099 | (2006.01) |

(52) U.S. Cl.
CPC ........... *H03L 7/1974* (2013.01); *H03K 21/026* (2013.01); *H03K 21/38* (2013.01); *H03L 7/0891* (2013.01); *H03L 7/099* (2013.01)

(58) Field of Classification Search
CPC ....... H03K 23/68; H03K 23/667; G06F 7/68
USPC .............................. 327/115–123; 377/47, 48
See application file for complete search history.

(56) References Cited

U.S. PATENT DOCUMENTS 5,077,764 A * 12/1991 Yamashita ........... H03K 23/667
                                                              377/108
5,371,772 A    12/1994 Al-Khairi
(Continued)

FOREIGN PATENT DOCUMENTS

| EP | 1346479 B1 | 8/2004 |
| EP | 2562938 A1 | 2/2013 |
| WO | 02052727 A1 | 7/2002 |

OTHER PUBLICATIONS

Zhang Song-Wei and Zhao Cheng, Design for realizing arbitrary fractional divider based FPGA which duty cycle is up to 50%, http://www.atlantis-press.com/php/download_paper.php?id=5758, Atlantis Press, Paris, France, 2013, pp. 1-4.
(Continued)

*Primary Examiner* — Lincoln Donovan
*Assistant Examiner* — Thomas Skibinski
(74) *Attorney, Agent, or Firm* — Iphorizons PLLC; Narendra Reddy Thappeta (57) ABSTRACT

A programmable frequency divider includes a cascade of frequency-dividing units, each capable of dividing by a first or a second factor. Each unit receives an input clock and generates a divided output clock. Each unit receives a mode control signal that specifies when to divide its input clock by the second factor if a control input allows it, otherwise dividing the input clock by the first factor. The frequency divider is designed to support a range of divide ratios that requires one or more of the units to be non-operative or unused in some intervals. The final divided clock is generated using the mode control signal of the lowest unit in the cascade and the mode control signal of the highest unit that is never set to be non-operative or unused in supporting the range. As a result, duty-cycle variations of the final divided clock are minimized.

14 Claims, 9 Drawing Sheets

(56) References Cited

U.S. PATENT DOCUMENTS

| | | | | |
|---|---|---|---|---|
| 5,590,163 | A | * | 12/1996 | Dufour ............... H03K 3/021 377/110 |
| 6,404,244 | B2 | * | 6/2002 | Flecheux ............ H03K 23/665 327/115 |
| 6,501,816 | B1 | * | 12/2002 | Kouznetsov ........ H03K 23/667 327/115 |
| 6,998,882 | B1 | | 2/2006 | Chung |
| 7,042,257 | B2 | * | 5/2006 | Wang .................. H03C 3/0925 327/115 |
| 7,521,972 | B2 | | 4/2009 | Wilson et al. |
| 8,552,770 | B2 | * | 10/2013 | Cavin ...................... G06F 1/08 327/115 |
| 2006/0017473 | A1 | * | 1/2006 | Hu ....................... H03K 23/667 327/115 |
| 2012/0032715 | A1 | * | 2/2012 | Subburaj ............. H03K 23/667 327/115 |
| 2012/0074993 | A1 | * | 3/2012 | Chen ......................... H03L 1/00 327/147 |

OTHER PUBLICATIONS

L, Romano, S. Levantino, S. Pellerano, C. Samori and A, Lacaita, Low Jitter Design of a 0.35μm-CMOS Frequency Divider Operating up to 3GHz, http://citeseerk.ist.psu.edu/viewdoc/download?doi=10.1,1,12.5856&rep=rep1&type=pdf, ESSCIRC 2002, pp. 611-614.

M. Jurgo, K. Kiela and R. Navickas, Design of Low Noise 10 GHz divide-by-16 . . . 511 Frequency Divider, http://dx.doi.org/10.5755/j01.eee.19.6.4570, Elektronika IR Elektrotechnika, ISSN 1392-1215, vol. 19, No. 6, 2013, pp. 87-90.

Mohit Arora, Clock Dividers Made Easy, http://ar.newsmth.net/att/f115b1581222f/Clock_divder_made_easy.pdf., SNUG Boston, 2002, pp. 1-19.

Gao Haijun, Sun Lingling, Cai Chaobo and Zhan Haiting, Pulse swallowing frequency divider with low power and compact structure, http://www.jos.ac.cn/bdtxben/ch/reader/create_pdf.aspx?file_no=12040901, Journal of Semiconductors vol. 33, No. 11, Nov. 2012, pp. 115004-1 to 115004-4 1.

Michael Perrott, Short Course on Phase-Locked Loops and Their Applications Day 2, PM Lecture, http://wenku.baidu.com/view/362e6f6eb84ae45c3b358c3e,html, Aug. 12, 2008, pp. 1-97.

Micheal Perrott, 6.976 High Speed Communication Circuits and Systems Lecture 14 High Speed Frequency Dividers, http://ocw.mit.edu/courses/electrical-engineering-and-computer-science/6-976-high-speed-communication-circuits-and-systems-spring-2003/lecture-notes/lec14.pdf, Massachusetts Institute of Technology, Copyright © 2003, pp. 1-46.

LMK01801 Dual Clock Divider Buffer, http://www.ti.com.cn/cn/lit/ds/symlink/lmk01801.pdf, Texas Instruments Incorporated, Copyright © 2012-2013, pp. 1-51.

* cited by examiner

FIG. 7

PROGRAMMABLE FREQUENCY DIVIDER PROVIDING OUTPUT WITH REDUCED DUTY-CYCLE VARIATIONS OVER A RANGE OF DIVIDE RATIOS

PRIORITY CLAIM

The instant patent application claims priority from co-pending India provisional patent application entitled, "FRACTIONAL-N FEEDBACK DIVIDER (DIVN) AND INTEGER-N FEEDFORWARD DIVIDER (DIVO)", Application Number: 3361/CHE/2015, Filed: 2 Jul. 2015, naming as inventors Perdoor et al, and is incorporated in its entirety herewith, to the extent not inconsistent with the content of the instant application.

BACKGROUND

1. Technical Field

Embodiments of the present disclosure relate generally to frequency dividers, and specifically to a programmable frequency divider providing output with reduced duty-cycle variations over a range of divide ratios.

2. Related Art

A frequency divider is an electronic circuit that receives a periodic input signal and generates a periodic output signal with a frequency that is less than or equal to the frequency of the input signal. The ratio of the frequency of the output signal to that of the input signal is referred to as the desired divide ratio, and can be an integer or a fraction. A fractional (desired) divide ratio may be achieved by using different integer divide ratios over multiple iterations such that the average value of the integer divide ratios equals the desired divide ratio (i.e., a fraction). The desired divide ratio may be programmable (i.e., selectable) by a user via corresponding input(s) to the frequency divider, and a frequency divider may be designed to support a range of integer divide ratios from a lowest limit to a highest limit. The desired divide ratio is hereafter referred to as 'user input', while the variable divide ratio used in each cycle/iteration is referred to simply as the 'divide ratio' for conciseness.

The duty cycle of a periodic signal is generally the ratio of the active duration (e.g., duration of logic high) to the period of the periodic signal. It may be desirable that the duty cycle of the output signal of a programmable frequency divider vary as little as possible despite changes in the divide ratio.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A programmable frequency divider includes a cascade of frequency-dividing units, each capable of dividing by a first or a second factor. Each unit receives an input clock and generates a divided output clock. Each unit receives a mode control signal that specifies when to divide its input clock by the second factor if a control input allows it, otherwise dividing the input clock by the first factor. The frequency divider is designed to support a range of divide ratios that requires one or more of the units to be non-operative or unused in some intervals. The final divided clock is generated using the mode control signal of the lowest unit in the cascade and the mode control signal of the highest unit that is never set to be non-operative or unused in supporting the range. As a result, duty-cycle variations of the final divided clock are minimized.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Example Device

Figure 1:
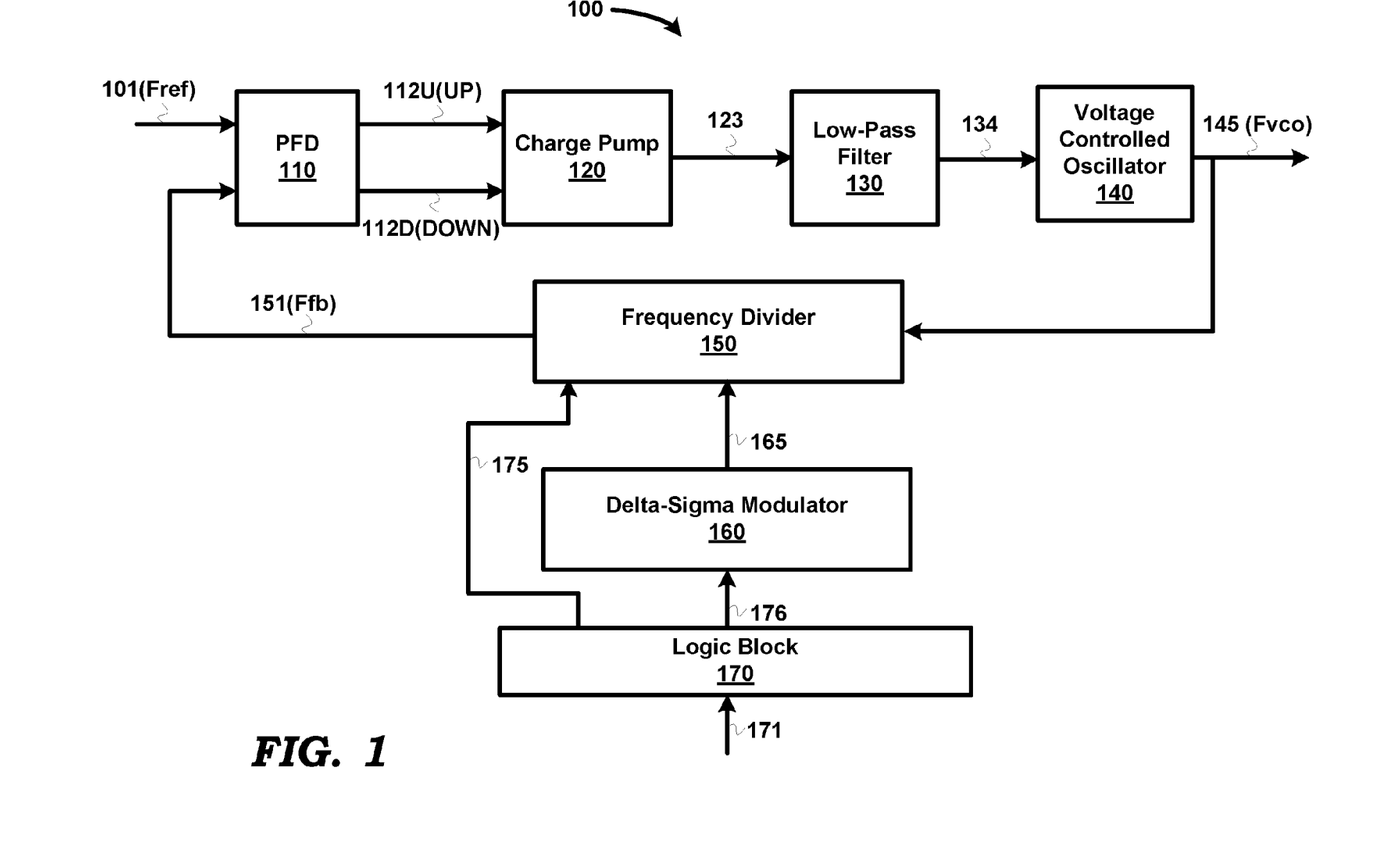
FIG. 1 is a block diagram of an example device in which several aspects of the present disclosure can be implemented.

FIG. 1 is a block diagram of an example device in which a frequency divider implemented according to several aspects of the present disclosure can be used. Phase locked loop (PLL) 100 (which can be used as a frequency synthesizer) of FIG. 1 is shown containing phase frequency detector (PFD) 110, charge pump 120, low-pass filter (LPF) 130, voltage controlled oscillator (VCO) 140, frequency divider 150, delta-sigma modulator (DSM) 160 and logic block 170. PLL 100 may be implemented as an integer-only PLL or a fractional PLL (as noted below), and may be implemented in integrated circuit (IC) form. It must be understood that while implementation of frequency divider 150 as described below may provide several advantages in the context of a PLL, frequency divider 150 may also be deployed as a stand-alone unit, or in other contexts as well.

VCO 140 generates an output signal Fvco on path 145, with the frequency of Fvco being determined by the (instantaneous) magnitude of voltage received on path 134. Fvco is typically a square wave or sinusoidal wave, and may be used by other systems (not shown) as a clock signal (after appropriate processing or conditioning, if so desired).

Frequency divider 150 receives Fvco as an input, divides the frequency of Fvco by a divide ratio, and provides the frequency-divided signal as a feedback signal Ffb on path 151.

Block 170 receives a user input (e.g., from a user or a processing block, not shown) on path 171, with the user input representing the number by which Fvco is to be divided to generate Ffb. When PLL 100 is implemented as a fractional PLL, block 170 forwards the fractional portion of the user input (on path 171) to DSM 160 on path 176, and the integer portion of the number (on path 171) to frequency divider 150 on path 175. DSM 160 generates (in one of several known ways) a sequence of divide values corresponding to (or representing) the fractional part. DSM 160 forwards the numbers in the sequence successively (one number per cycle of reference frequency 101, with the sequence repeating after the last number in the sequence is forwarded) to frequency divider 150 on path 165. Frequency divider 150 determines the divide ratio per cycle (i.e., the divide ratio to be obtained in each cycle) of reference frequency 101 by adding the inputs received (on paths 175 and 165) corresponding to the cycle. Alternatively, such addition may be performed in a separate block, not shown, which would then provide the sum to frequency divider 150. Thus, when fractional division of Fvco is desired, frequency divider 150 successively divides Fvco by values in a sequence, such that the effective average frequency of Ffb equals the desired fraction of Fvco. When PLL 100 is implemented as an integer-only PLL, DSM 160 is not implemented, and block 170 forwards the integer number received on path 171 to frequency divider 150 on path 175, the integer number itself representing the divide ratio. In an alternative embodiment, the input received on path 171 represents a desired output frequency (for Fvco), and block 170 computes the corresponding divide ratio based on input 171.

PFD 110 receives as inputs, a reference frequency Fref on path 101 and feedback signal Ffb on path 151, and operates to generate error signals UP and DOWN on respective paths 112U and 112D. The ON (active) durations of error signals UP and DOWN are proportional to the amount of phase by which Fref leads or lags Ffb respectively. Reference frequency Fref may be generated by an oscillator (not shown) contained within PLL 100, or provided external to PLL 100.

Charge pump 120 converts the UP and DOWN outputs of PFD 110 to charge (provided on path 123). Path 123 may be single-ended or differential, depending on whether charge pump 120 is designed to provide a single-ended or differential output. While signals UP and DOWN have been noted as being applied to charge pump 120, signals derived from UP and/DOWN (e.g., logical inverse of the signals) may instead be applied to charge pump 120 depending on the specific design of charge pump 120. LPF 130 is a low-pass filter and rejects frequency variations at node 123 above a certain cut-off limit. LPF 130 converts the low-pass-filtered charge to a voltage 134. VCO 140 generates Fvco with a frequency that is dependent on the magnitude of voltage.

The components/blocks of FIG. 1 may be designed to enable generation of Ffb 151 with frequencies in a desired range (lower limit to upper limit, both of which may be pre-determined at the time of design of the frequency divider) by appropriate choice of the divide ratio provided as input to frequency divider 150. It is generally desired that frequency divider 150 be implemented with minimal complexity, and also be able to generate Ffb 151 (which is the output signal of frequency divider 150) with minimal variation in duty cycle, as long as the divide ratio is within the pre-determined range noted above. Reduction in variation of duty cycle of Ffb 151 generally improves the linearity of (the transfer characteristics) of PFD 110, which in turn may translate to lower phase-noise/jitter in Fvco.

Several aspects of the present disclosure are directed to a frequency divider with the above-noted desired characteristics, as described in detail below. However, the building blocks used to implement such a frequency divider are first described next.

3. Frequency-Dividing Unit

Figure 2A:
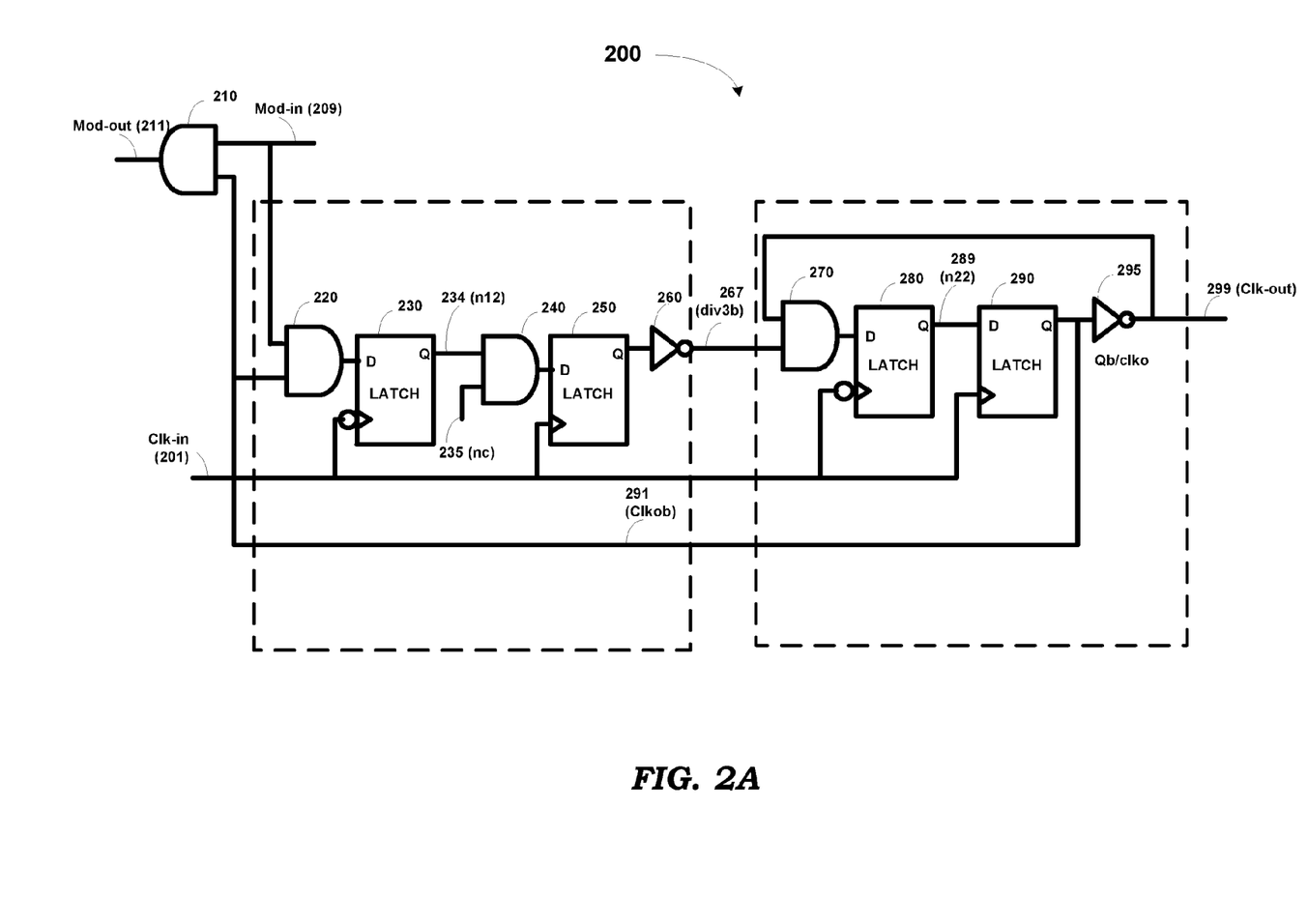
FIG. 2A is a block diagram of a frequency-dividing unit that is used to build a frequency divider, in an embodiment of the present disclosure.

FIG. 2A is a block diagram of a frequency-dividing unit that is used in building a programmable frequency divider according to aspects of the present disclosure. Two or more of such units as unit 200 of FIG. 2A may be cascaded (connected in series) to obtain a frequency divider which supports a desired range of divide ratios. In the embodiment of FIG. 2A, frequency-dividing unit 200 is a divider which can divide an input signal by 2 or 3, as controlled by corresponding signals, described below. Only a brief description of unit 200 (with reference also to the timing diagram of FIG. 2B) is provided herein, as the design of such unit is well-known in the relevant arts. For more details of unit 200, the reader is referred to the lecture notes available from MIT OpenCourseWare at http://ocw.mit.edu/courses/electrical-engineering-and-computer-science/6-976-high-speed-communication-circuits-and-systems-spring-2003/lecture-notes/lec14.pdf.

Frequency-divider unit 200 is shown containing AND gates 210, 220, 240 and 270, latches 230, 250, 280 and 290, and inverters 260 and 295. Frequency-dividing unit 200 receives an input signal Clk-in (201), and generates an output signal Clk-out (299) whose frequency is a either half, or one-third of the frequency of Clk-in 201. Other signals shown in FIG. 2A and/or FIG. 2B include nc (235) and Mod-in (209), Mod-out (211), n12 (234), div3b (267), n22 (289) and clkob (291). Nc is a control signal (binary signal) provided as input to frequency-dividing unit 200, and which determines if frequency-dividing unit 200 is to be allowed to divide by 3 at all (or divide by 2 only). Mod-in 209 is a mode control signal received from another unit (not shown), and determines when (i.e., at what time instant) frequency-dividing unit 200 is to divide by 3. Mod-out (211) is a mode control signal generated by frequency-dividing unit 200, and may be connected as an input to a previous stage (not shown). The other signals noted above are signals internal to frequency-dividing unit 200.

Figure 2B:
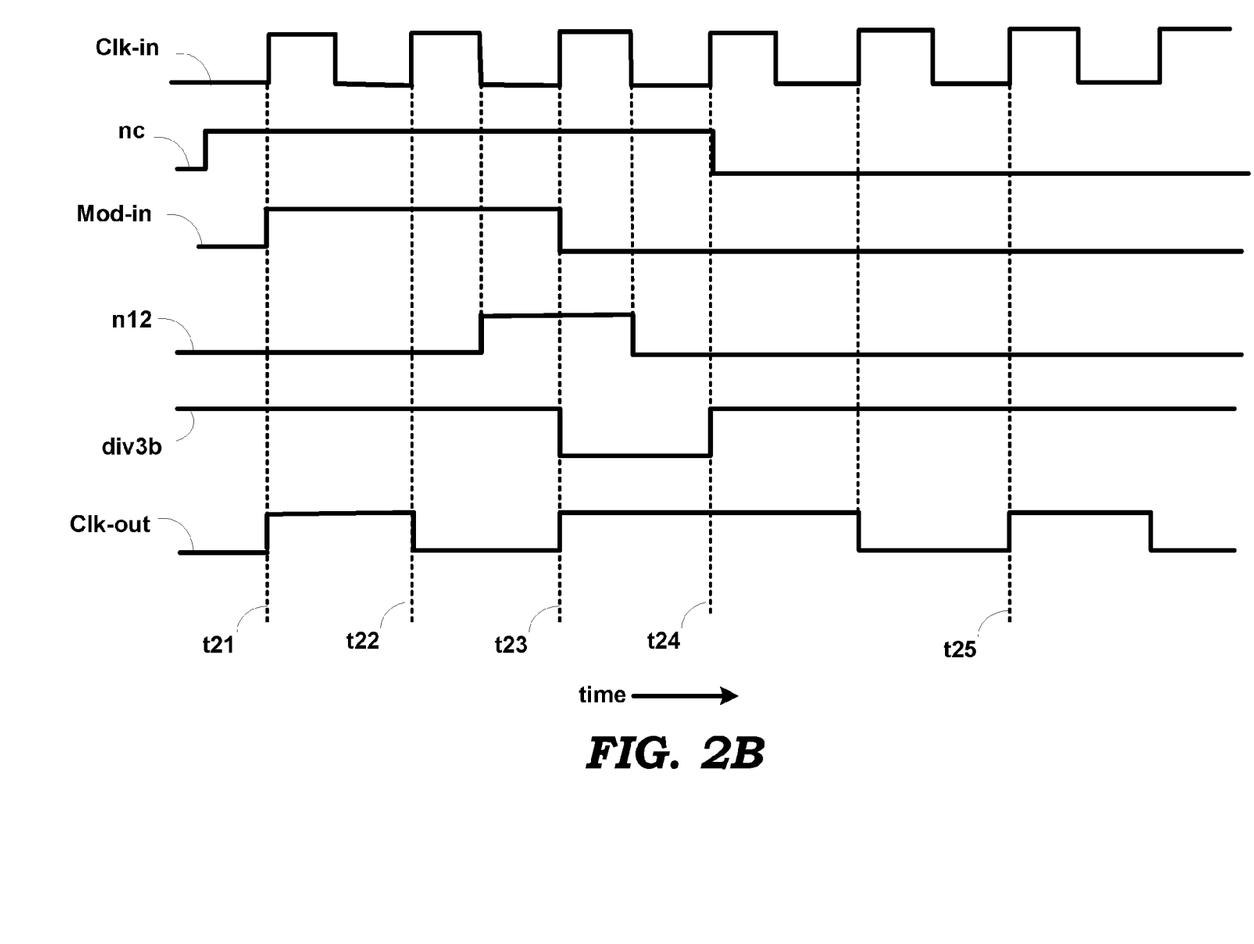
FIG. 2B is a timing diagram illustrating the operation of a frequency-dividing unit used in an embodiment of the present disclosure.

As may be observed from FIG. 2B, in the interval t21 to t23, frequency-dividing unit 200 operates as a divide-by-2 unit, while in the interval t23 to t25 frequency-dividing unit 200 operates as a divide-by-3 unit. In interval t22-t23, signals nc and Mod-in are high, and cause frequency-dividing unit 200 to divide by 3 in the interval between t23 and t25. Mod-in transitions to logic low at t23, and thereafter, nc transitions to logic low at t24 and remains at logic low. In response, frequency-dividing unit 200 operates as a divide-by-2 unit from t25. By appropriate control of nc and Mod-in, frequency-dividing unit 200 can be made to operate as a divide-by-2 or divide-by-3 unit.

Figure 3A:
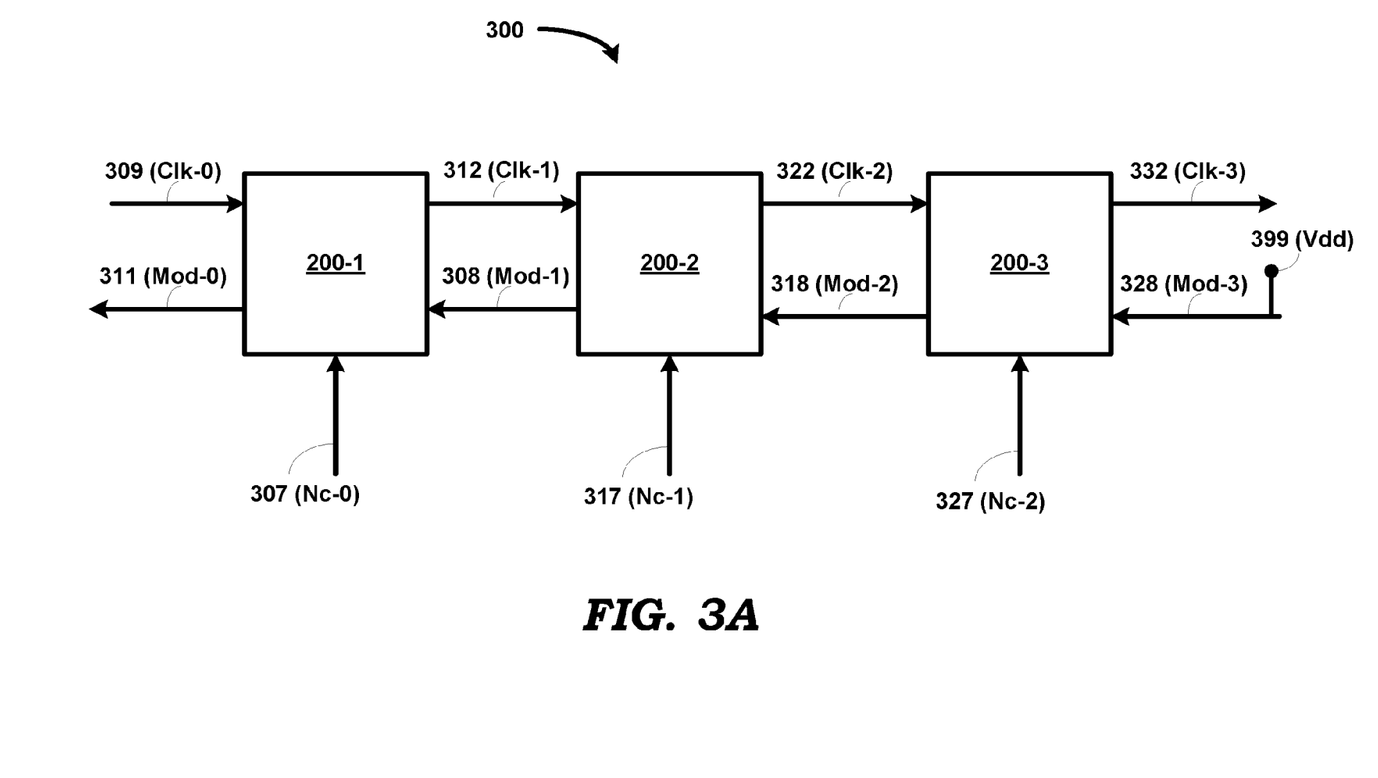
FIG. 3A is a block diagram of a frequency divider built using a cascade of three frequency-dividing units, in an embodiment of the present disclosure.
Figure 3B:
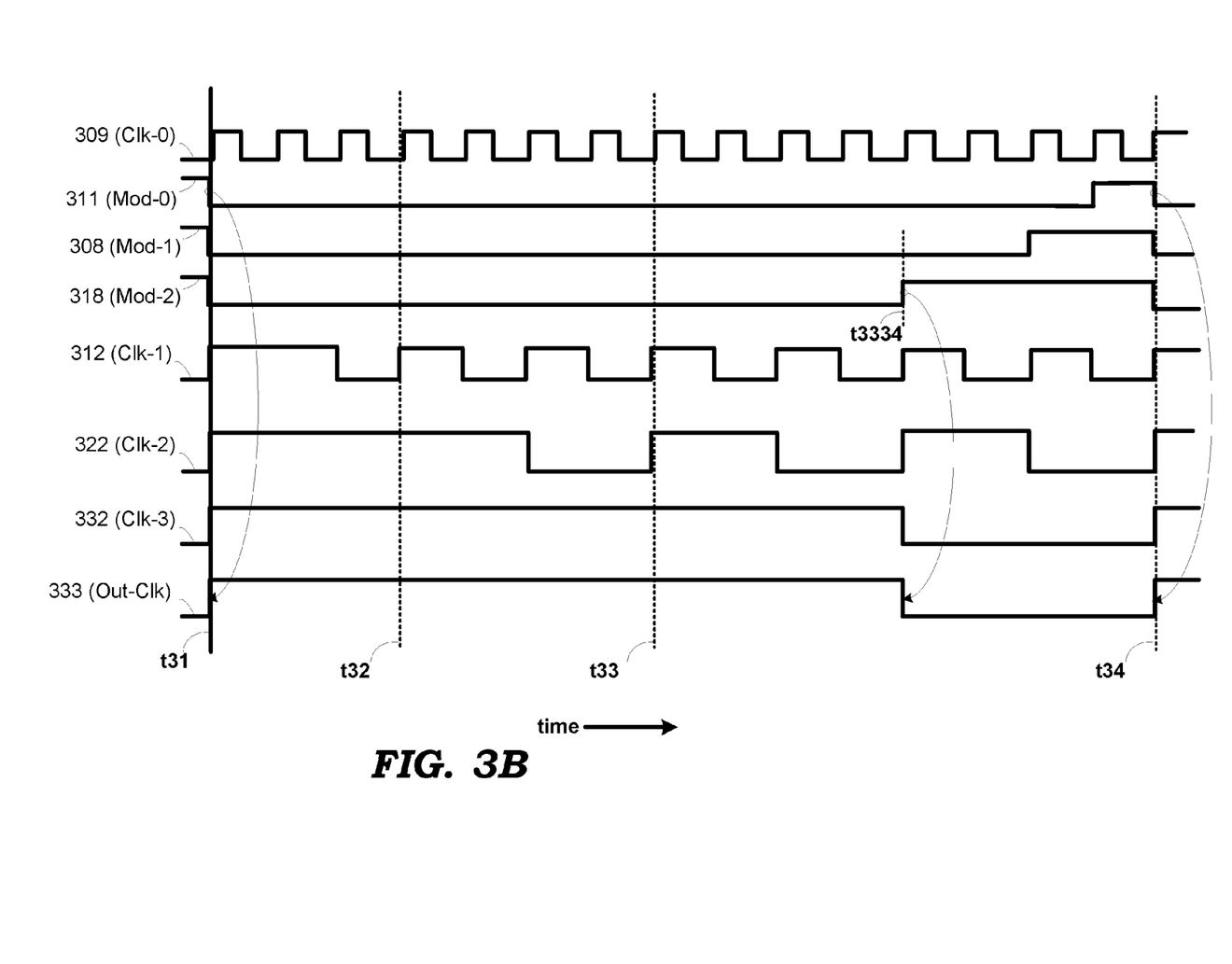
FIG. 3B is a timing diagram illustrating the operation of a frequency divider in an embodiment of the present disclosure.

By connecting multiple ones of units such as a frequency-dividing unit 200 in series (i.e., in a cascade), corresponding ranges of divide ratios between an input signal and an output signal are achieved. As an example, a cascade of three units such as frequency-dividing unit 200 forming a frequency divider 300 is shown in FIG. 3A, and the timing diagram of 3B shows the corresponding waveforms when a divide ratio of 15 is desired. In general, frequency divider 150 adds the integer portion received on path 175 and the DSM output received on path 165 to obtain the bit values of Nc-2, Nc-1 and Nc-0 (of FIG. 3A).

In FIG. 3A, three units, each identical to frequency-dividing unit 200, are used in a cascade. Clk-0 (309) is the input signal, and is provided as input to the first unit 200-1. Unit 200-1 receives as input a mode control signal 308 (Mod-1) from the next (higher) stage (or unit) 200-2, and a control signal 307 (Nc-0). Depending on the value of Nc-0, unit 200-1 performs only divide-by-2 division, or divide-by-3 once in a divide cycle (explained below) and divide-by-2 the rest of the divide cycle. Unit 200-1 provides a divided clock Clk-1 (312) and a mode control signal 311 (Mod-0) as outputs.

Unit 200-2 receives Clk-1 (312) as an input clock. Unit 200-2 receives as input a mode control signal 318 (Mod-2) from the next (higher) stage 200-3, and a control signal 317 (Nc-1). Depending on the value of Nc-1, unit 200-2 performs only divide-by-2 division or divide-by-3 once in a divide cycle and divide-by-2 the rest of the divide cycle. Unit 200-2 provides a divided clock Clk-2 (322) and mode control signal 308 (Mod-1) as outputs.

Unit 200-3 receives Clk-2 (322) as an input clock. Unit 200-3, being the 'highest' unit, the mode control signal 328 (Mod-3) provided as input to unit 200-3 is tied to logic high. Unit 200-3 receives a control signal 327 (Nc-2). Depending on the value of Nc-2, unit 200-3 performs only divide-by-2 division, or divide-by-3 once in a divide cycle and divide-by-2 the rest of the divide cycle. Unit 200-3 provides a divided clock Clk-3 (332) and mode control signal 318 (Mod-2) as outputs. Control signals Nc-0, Nc-1 and Nc-2, each of which is a binary signal, may be received from a unit external to divider 300 (and based on user inputs on path 171, for example), and their values determine the specific divide ratio to be used by divider 300. Input terminals 307, 317 and 327 together represent the "divide input" of divider 300. Unit 200-1 is the 'lowest' (first) unit, while 200-3 is the 'highest' unit.

Referring to FIG. 3B, a 'divide cycle' refers to the duration of one cycle of the clock output of the highest operative unit (the term highest operative unit is clarified in sections below). Thus, in the example of FIGS. 3A and 3B, a divide cycle is the duration t31 to t34, also equal to one period of Clk-3. While Clk-3 has the desired frequency (1/15 of that of Clk-0), according to an aspect of the present disclosure, instead of Clk-3, an output clock derived from Mod-0, Clk-0 and one of the other mode control signals is provided as the final divided clock 333 (Out-Clk), as described in sections below. When divider 300 is used in place of frequency divider 150 of FIG. 1, Out-Clk (333) would represent Ffb (151).

In the example of FIG. 3A, it is assumed that each of Nc-0, Nc-1 and Nc-2 is set to logic high (one), as noted above. Therefore, each of stages/units 200-1, 200-2 and 200-3 divides-by-3 once in a divide cycle. Unit 200-1 divides-by-3 in interval t31-t32, unit 200-2 divides-by-3 in interval t31-t33, and unit 200-3 always divides by 3. The values for the waveforms shown in FIG. 3B repeat after t34. Clk-3 has a frequency that is 1/15 of that of Clk-1. The general expression that specifies the divide ratios that can be obtained by divider 300 is: $[2^3+(Nc-2)\ 2^2+(Nc-1)\ 2^1+(Nc-0)2^0]$. By appropriate selection of Nc-2, Nc-1 and Nc-0, a divide ratio in the range 8 to 15 (both inclusive) can be obtained. In general, with a cascade of 'k' units/stages, a range of $[2^k, 2^{k+1}-1]$ can be obtained.

Figure 4:
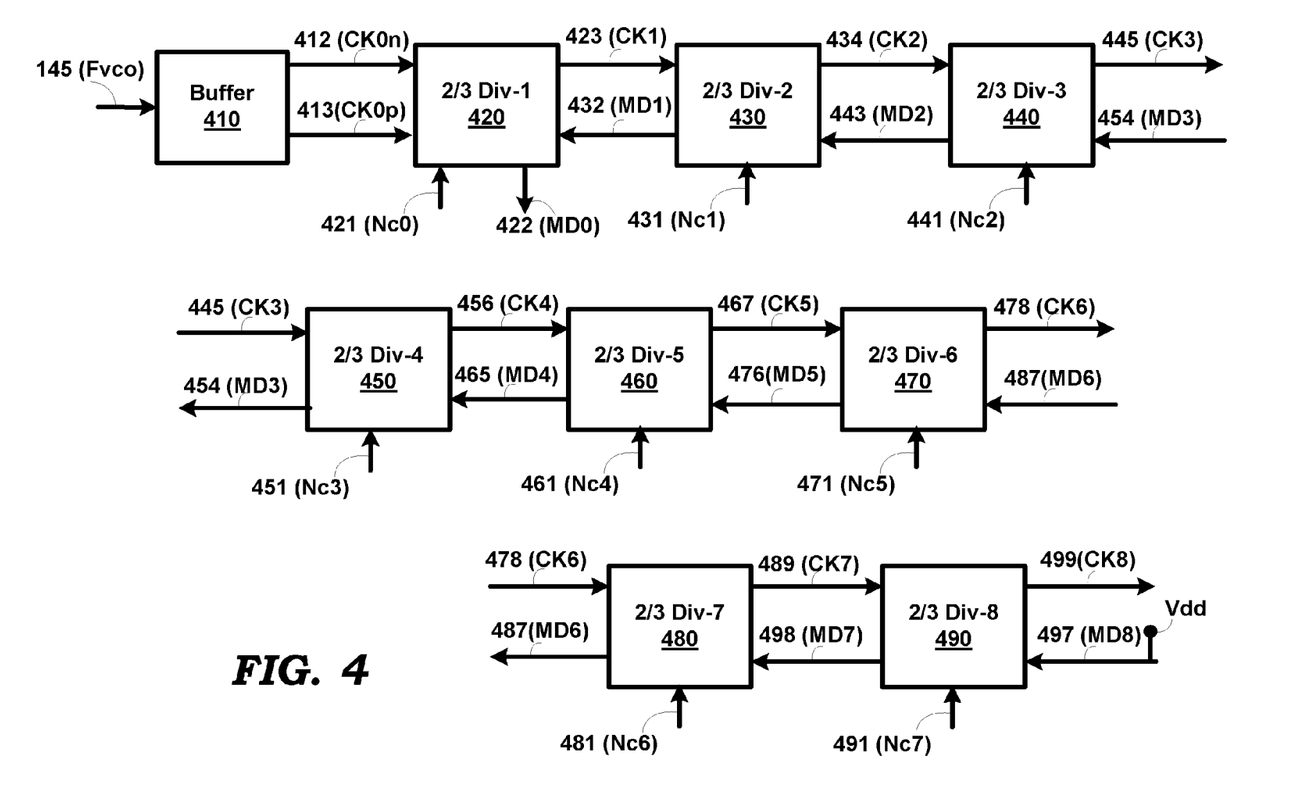
FIG. 4 is a block diagram of a frequency divider built using a cascade of eight frequency-dividing units, in an embodiment of the present disclosure.

Thus, for example with eight cascaded stages (and assuming all eight stages are operated), a divide range of [256, 511] can be obtained, and such a cascade is illustrated in FIG. 4. In FIG. 4 are shown buffer 410, and divide-by-2/3 units (each identical to frequency-dividing unit 200 of FIG. 2) 420 through 490 contained in frequency divider 150, in an embodiment of the present disclosure.

Buffer 410 receives Fvco (145 in FIG. 1), which represents the input signal whose frequency is to be divided by a desired divide ratio. Buffer 410 provides additional drive to Fvco, and generates a corresponding differential signal CK0n/CK0p (across terminals 412 and 413), and which has the same frequency as Fvco. Each of units 420-490 receives a corresponding clock signal, control signal (nc) and a mode control signal as inputs, and generates a divided clock signal and a mode control signal. The corresponding connections are shown in FIG. 4, and are briefly summarized below.

Unit 420 receives Ck0n (412) and Ck0p (413) as an input clock. Unit 420 receives as input a mode control signal 432 (MD1) from the next higher stage unit 430, and a control signal 421 (Nc0). Depending on the value of Nc0, unit 420 performs only divide-by-2 division or divide-by-3 once in a divide cycle and divide-by-2 the rest of the divide cycle. Unit 420 provides a divided clock CK1 (423) and mode control signal 422 (MD0) as outputs. The rest of the units operate similarly, with signals 434 (CK2), 445 (CK3), 456 (CK4), 467 (CK5), 478 (CK6), 489 (CK7) and 499 (CK8) being the respective clock output signals of units 430, 440, 450, 460, 470, 480 and 490, and which are provided as inputs to the corresponding next higher unit. Units 430-490 receive respective control signals 431 (Nc1), 441 (Nc2), 451 (Nc3), 461 (Nc4), 471 (Nc5), 481 (Nc6) and 491 (Nc7). Units 430-490 receive respective mode control signals 443 (Md2), 454 (MD3) 465 (MD4), 476 (MD5), 487 (MD6), 498 (MD7) and 497 (MD8). Input terminals 421, 431, 441, 451, 461, 471, 481 and 491 together represent the "divide input" of frequency divider 150. Control signals Nc0 through Nc7, each of which is a binary signal, may be received from a unit external to frequency divider 150 (and based on user inputs, for example), and their values determine the specific divide ratio to be used by frequency divider 150. With reference to FIG. 1, control signals Nc0-Nc7 may be received on the combined input path represented by paths 175 and 165. Specifically, frequency divider 150 adds the integer portion received on path 175 and the DSM output received on path 165 to obtain the bit values of Nc0-Nc7. While the divide input of Frequency divider 150 are shown as being directly connected to the respective 2/3 divide units, the divide inputs may be processed (e.g., latched on an edge of Fvco, etc.,), and the processed values then provided as inputs to the units.

In FIG. 4, MD8 is shown tied to logic high (Vdd/power supply). This implies that all the divide units 420-490 are operational (i.e., powered-ON and used in operation of frequency divider 150), with 420 being the first unit and 490 being the highest unit. Since eight units are used, the possible divide range is [256, 511]. If divide ratios less than 256 are also desired (in addition to the range [256, 511], one or more of the higher units need to be switched off (or not used even if powered-ON), and the resulting highest (rightmost in the cascade of units) mode control signal should be tied to logic high. To illustrate, assuming only the first seven units 420-480 are operated, with unit 490 switched off (or not used), then MD7 needs to be tied to logic high. With such an arrangement a divide range of [128, 255] is obtained.

Similarly, with only the first six units (420 through 470) operational (480 and 490 being switched off or not used), MD6 is tied to logic high. With such an arrangement a divide range of [64, 127] is obtained. Similarly, with only the first five units (420 through 460) operational (470, 480 and 490 being switched off or not used), then MD5 is tied to logic high. With such an arrangement a divide range of [32, 63] is obtained. In the example of FIG. 4 and the corresponding timing diagram of FIG. 5 (described below), it is assumed that frequency divider 150 is designed to support (only) a range of [32, 511], 32 being the lowest divide ratio (lowest limit) and 511 being the highest divide ratio (highest limit) that frequency divider is designed to provide. It may be noted that by extending the same logic as above, even lower values of divide ratios may be obtained. However, it is assumed that frequency divider 150 is designed to only provide the range [32, 511], and various portions of frequency divider 150 may be fixed by design to support only that range. The manner in which the final divided signal (Ffb 151) is obtained is described next.

Referring now to FIGS. 3A and 3B, while Clk-3 has the desired frequency (⅟₁₅ of that of Clk-0), according to an aspect of the present disclosure, instead of Clk-3, the output clock (out-Clk 333) is derived from Mod-0, Clk-0 and one of the other mode control signals. The reason Clk-3 is not used as the divided clock is that Clk-3 may contain an unacceptable level of phase-noise or jitter. In general, each stage 200-1, 200-2 and 200-3 adds some amount of jitter to the clock received from the previous stage. Referring to FIG. 3B, Mod-0 is a signal that is directly derived from Clk-1. In particular, with additional reference to FIG. 2A, mod-0 of FIG. 3A is obtained by ANDing the logical inverse of Clk-1 and mod-1. Since Mod-0 is 'closest' to input clock Clk-0, Mod-0 has the least jitter/phase noise among all the mode control signals, while also (always) having a frequency equal to that of Clk-3.

Hence, rising edges of Out-Clk (333) are generated (by a circuit similar to that described below) to coincide with falling edges of Mod-0. The falling edges of Out-Clk are generated to coincide with the rising edges (as at t3334 in FIG. 3B) of the mode control signal (Mod-2) output by the highest operative stage (while supporting any divide ratio within the range [8-15]). It may be observed that while the rising edges of Mod-1 could also have been used to trigger the falling edges of Out-Clk, this would result in Out-Clk having a duty cycle that would deviate more from 50% duty cycle than if Mod-2 were used. It is to be noted that if a divide ratio of less than eight was required, then the mode control signal used to generate the falling edge of Out-Clk would have been different, as illustrated better with FIG. 4 and FIG. 5.

Figure 5:
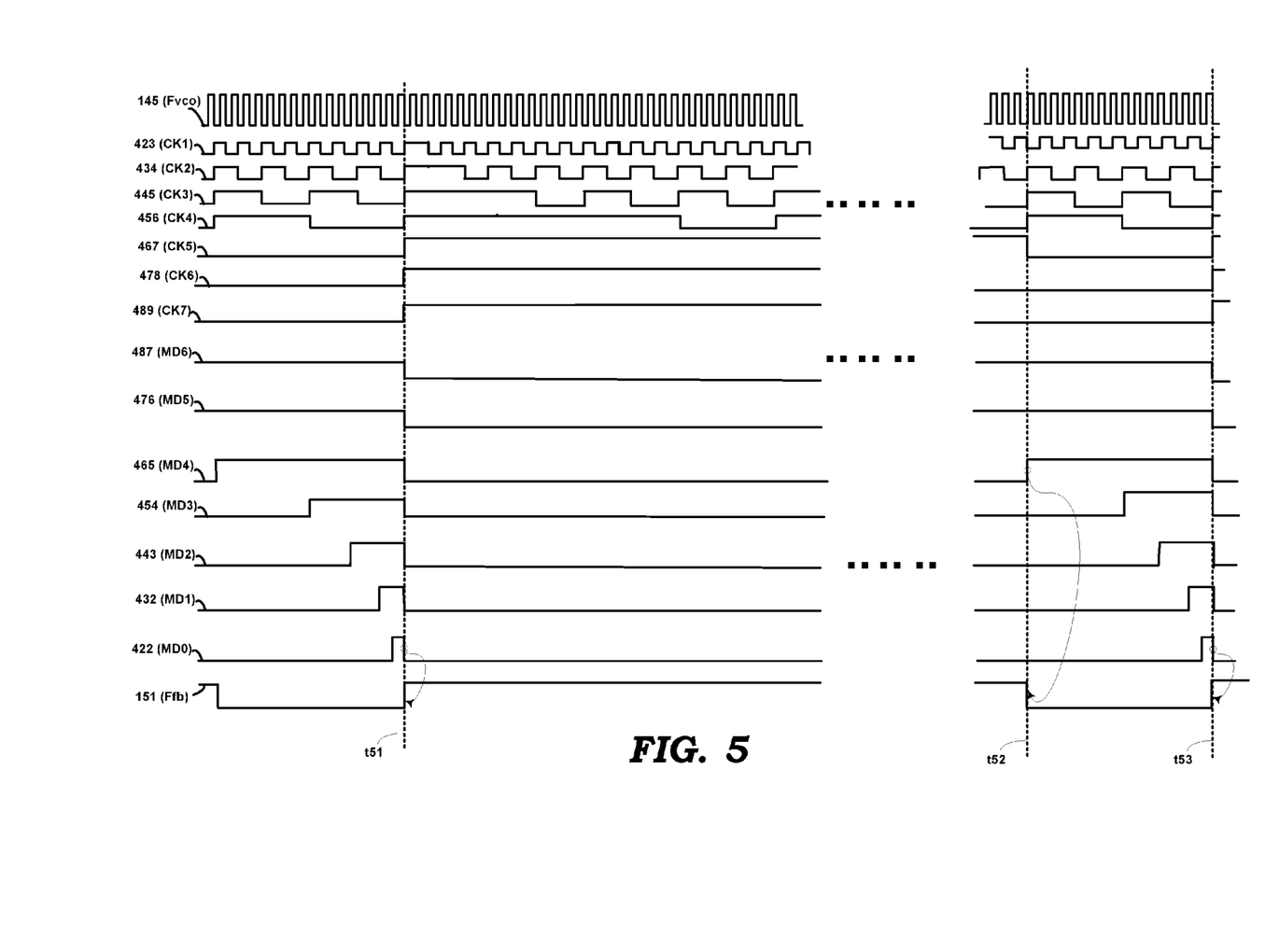
FIG. 5 is a timing diagram illustrating the operation of a frequency divider in another embodiment of the present disclosure.

In the circuit of FIG. 4, since it is not guaranteed that MD7, MD6 and MD5 will never be set to logic high (to support the corresponding ranges noted above), the rising edges of MD4 are always used to generate the falling edges of Ffb, irrespective of the specific divide ratio within the range between the lowest divide ratio (32 here) and the highest divide ratio (511) that frequency divider 150 is designed to support. FIG. 5 is a timing diagram illustrating waveforms at various nodes of the circuit of FIG. 4. For conciseness, waveforms of CK8 and MD8 have been omitted from FIG. 5. Further, although not shown in FIG. 5, the waveform of signal CK0n is the same as that of Fvco, while that of CK0p is the inverse of Fvco.

It may be observed that, the rising edges (e.g., at t51 and t53) of Ffb are generated to coincide with falling edges of MD0, while the falling edges (e.g., at t52) are generated to coincide with the rising edges of MD4, which is the mode control signal generated by the highest (rightmost) unit of the cascade that is always operative during the operation of frequency divider 150 (while supporting any divide ratio within the range [32-511]). The high pulse duration of MD4 always equals 16 cycles of Fvco, irrespective of the specific divide ratio chosen (within the range from lowest limit to highest limit). As a result, the logic-low duration (t52-t53 in FIG. 5) of Ffb 151 is always fixed irrespective of the specific divide ratio chosen (within the range from lowest limit to highest limit). Therefore, variations in duty cycle of Ffb across divide ratios are kept minimal, or at least less than that in some prior implementations of a frequency divider using frequency-dividing units such as those noted above.

For example, one prior implementation of a frequency divider that uses frequency-dividing units such as those noted above, uses the output clocks (e.g., CK6, CK7, CK8, etc) of the appropriate frequency-dividing unit to generate Ffb 151. Depending on the specific divide ratio to be provided, the prior implementation therefore utilizes the output clock of the highest operative unit (as noted above) to generate Ffb 151. For example, when the divide ratio falls in the divide range [64, 127], the prior technique would use CK6 to generate Ffb 151. When the divide ratio falls in the divide range [128, 255], the prior technique would use CK7 to generate Ffb 151. As a result, when the fractional value 165 is such that the sequence generated by DSM 160 contains numbers on either side of the boundary between a pair of divide ranges, a large variation in duty cycle of Ffb 151 results. In the above example, assuming that the sequence generated by DSM 160 is 125, 126, 127, 128, 129, 130, for the first three values (namely 125, 126 and 127), the prior technique would use CK6 to generate Ffb 151, and for the last three values (namely 128, 129, 130), the prior technique would use CK7 to generate Ffb 151. For the first three values (namely 125, 126 and 127), the duty cycle of CK6 is close to 75%, while for the last three values (namely 128, 129 and 130), the duty cycle of CK7 is close to 50%. Hence, the prior technique results in large duty cycle variations in Ffb 151 when the sequence generated by DSM 160 contains numbers on either sides of a boundary between a pair of divide ranges. The prior technique may also required additional hardware for selecting the desired one of the output clocks (e.g., CK6, CK7, CK8, etc). According to aspects of the present disclosure however, the same signal (MD4 in the example described above) is used to generate the falling edges of Ffb 151, irrespective of the specific divide range (within the pre-determined range, as noted above) in which numbers of a sequence generated by DSM 160 fall. As a result, duty cycle variations are reduced, even when the sequence generated by DSM 160 contains numbers on either sides of a boundary between a pair of divide ranges.

It is noted that although the logic-low duration of Ffb (151) as obtained in embodiments of the present disclosure are fixed, the logic-high durations (such as t51-t52 of FIG. 5) of Ffb (151) may vary depending on the specific value (or number) received on path 165. However, such variations are not very high for a desired fractional value of input 171, since the sequence of numbers generated by DSM 160 for any particular fractional value do not vary greatly.

Figure 6:
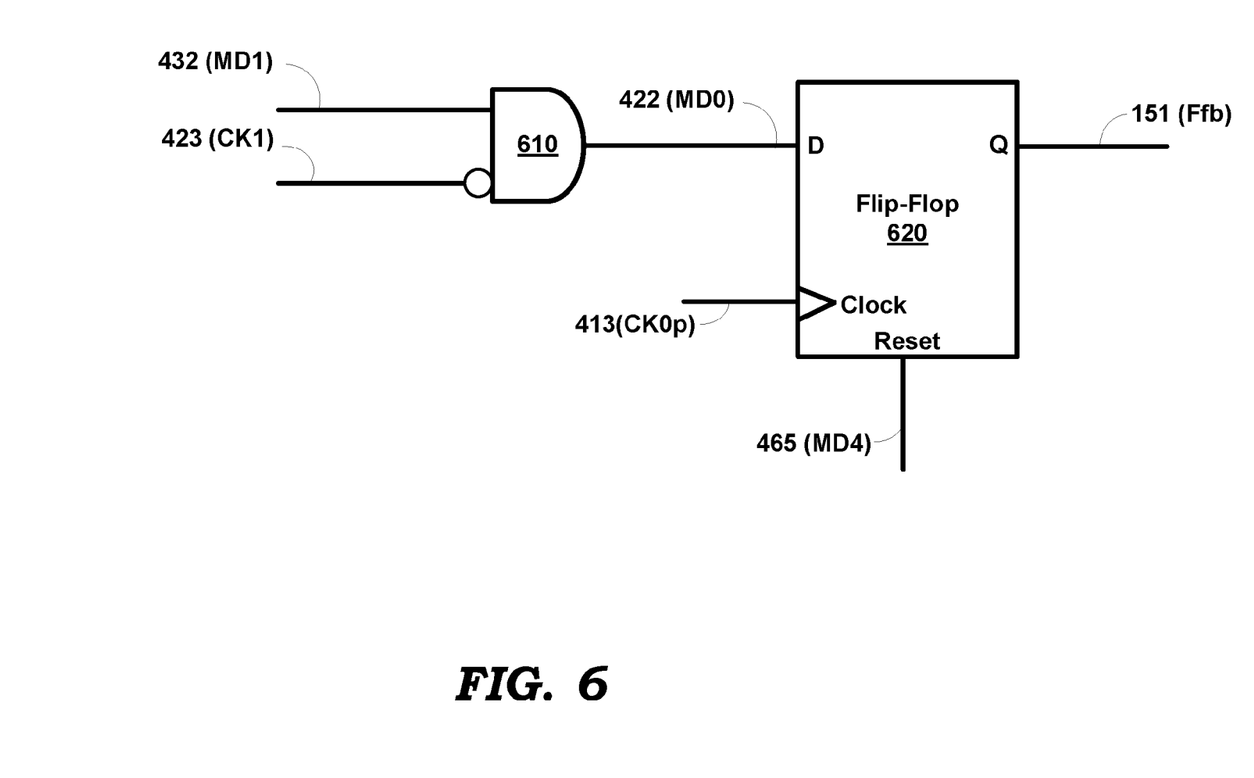
FIG. 6 is a block diagram of a portion of a frequency divider, illustrating the manner in which an output signal of the frequency divider is generated, in an embodiment of the present invention.

FIG. 6 is a circuit contained within frequency divider 150, and illustrates the manner in which the rising and falling edges of Ffb (151) are generated, in an embodiment of the present disclosure. AND gate (610) receives MD1 (432) and the logical inverse of CK1 (423) as inputs, and generates MD0 (422). MD0 is provided as the input (D) to flip-flop (FF) 620, which stores the logical value of MD0 on the rising edge of CK0$p$ (413) (the logical value of MD0 at the rising edge of CK0$p$ being logic high), which is provided to the clock input of FF 620. FF 620 provides the stored value as output (Q), which is provided as the output signal 151 (Ffb) of frequency divider 150. Mode control signal MD4 (465) (referred to as resetting mode control signal) is connected to the asynchronous reset input of FF 620. A logic high value of MD4 resets the output (Q). When unit 420 of frequency divider 150 is designed to generate MD0, then AND gate 610 is not implemented. Further, while CK0$p$ is shown as being provided to the clock input of FF 620 (which may be viewed as a logic unit), in general the clock input may be viewed as being driven by Fvco. Thus, rising edges of Ffb 151 are generated by falling edges (or in general, period-defining edges) of MD0, while falling edges of Ffb 151 are generated by rising edges of MD4.

Ignoring any delays in AND gate 610 and FF 620, the rising and falling edges of Ffb may be viewed respectively as coinciding with (or defined by) the falling edges of MD0 and rising edges (period-defining edges, in general) of MD4.

Out-Clk (333) of divider 300 is generated similar to Ffb as described above with respect to the circuit of FIG. 6, with Clk-0 used in place of CK0$p$, Mod-1 and Clk-1 in place of MD1 and CK1 respectively, and Mod-2 in place of MD-4. It is to be understood that while the rising and falling edges of the output signal of a frequency divider implemented according to aspects of the present disclosure are noted as being generated based on (or coinciding with) corresponding events/signals, the output signal can be inverted, and therefore the edges reversed also.

PLL 100 incorporating frequency divider 150 implemented as described in detail above can be used as part of a system as described next.

4. System

Figure 7:
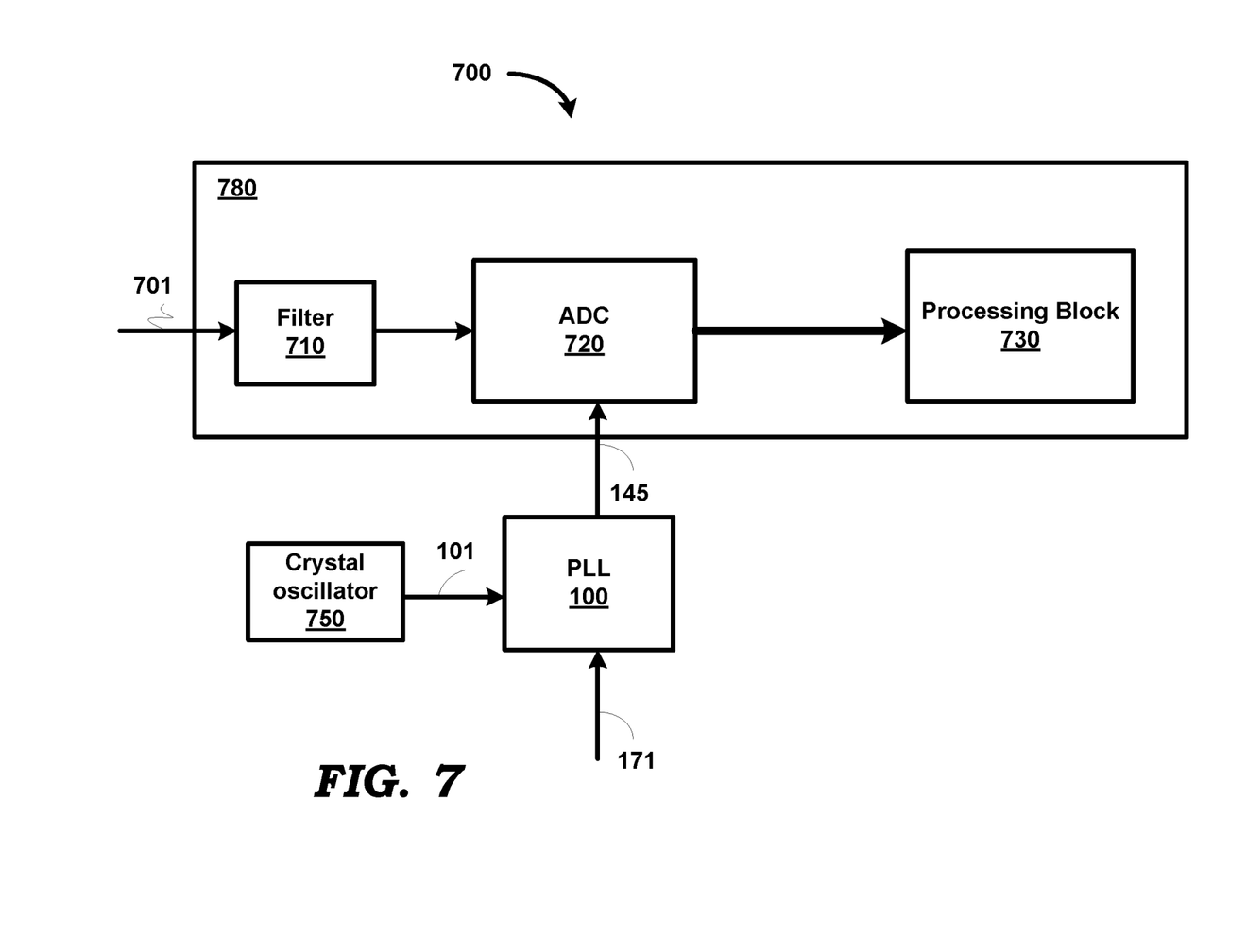
FIG. 7 is a block diagram of a system incorporating a PLL implemented according to several aspects of the present disclosure.

FIG. 7 is a block diagram of a system in which a PLL implemented according to aspects of the present disclosure can be used. System 700 is shown containing signal processing block 780, crystal oscillator 750 and PLL 100. Signal processing block 780 is in turn shown containing filter 710, analog to digital converter (ADC) 720 and processing block 730.

Filter 710, which may be an anti-aliasing filter, of system 100 receives an analog signal on path 701, and provides a filtered signal (low-pass or band-pass filtered) to ADC 720. ADC 720 receives a sampling clock on path 145 from PLL 100, and generates digital codes representing the magnitude of the received filter signal at time instances (e.g., rising edges) specified by sampling clock 145. Processing block 730 receives the digital codes, and processes the digital codes in a desired manner (for example for signal processing applications).

Crystal oscillator 750 generates reference frequency 101 at a fixed (desired) frequency. PLL 100 receives input 171 and reference frequency 101, and generates sampling clock 145 at a frequency determined by input 171 and reference frequency 101. As noted above, PLL 100 is designed to support divide ratios only in a range from a lowest divide ratio to a highest divide ratio, and generates sampling clock 145 with minimized phase noise/jitter (due to minimized duty-cycle variations of Ffb), as also noted above. As a result, system 100 can be implemented as a high-accuracy signal processing system.

5. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1 through 7, although various pairs of terminals/nodes are shown with direct connections, it should be appreciated that additional components (as suited for the specific environment) may also be present in the path between each pair of terminals/nodes. When there is a current path (with or without additional components) between any pair of terminals/nodes, the pair is said to be "electrically coupled". On the other hand, when a node is "connected to" or "directly connected to" another node (of a pair), it means that there are no intervening components between the pair of nodes, and the two nodes are effectively a single node or the connection between them is an electrical short (zero or very low resistance).

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A programmable frequency divider to receive an input signal (Fvco) having a first frequency, and to generate an output signal (Ffb) having a second frequency, said programmable frequency divider comprising:
   a divide input for receiving a divide ratio, wherein said divide ratio is representative of a number by which the frequency of said input signal (Fvco) is to be divided to generate said output signal (Ffb), wherein said divide ratio is between a lowest limit and a highest limit, said divide ratio being represented by a set of bits;
   a cascade of M frequency-dividing units coupled in series, said cascade comprising a lowest unit and a highest unit, with the remaining of the M units being disposed in series between said lowest unit and said highest unit, wherein the highest unit is the $M^{th}$ unit, and the lowest unit is the first unit in said cascade, said lowest unit being coupled to receive said input signal (Fvco),
   wherein the range of values by which the frequency of said input signal can be divided by said cascade depends on the number of frequency-dividing units of said cascade that are operative, whereby said range of values is a first range if N successive frequency-dividing units of said M units are operative, but a second range, not equal to said first range, if (N−1) frequency-dividing units are operative,
   wherein each frequency-dividing unit in said cascade comprises:
      a first input for receiving an input clock;
      a first output for providing an output clock to the next frequency-dividing unit in said cascade;
      a second output for providing a mode control signal to a previous frequency-dividing unit of said cascade; and a second input for receiving a corresponding bit in said set of bits, said corresponding bit having a logic level depending on said divide ratio, wherein the logic value received at said second input determines whether the frequency-dividing unit divides by a first factor or a second factor;

a third input for receiving a mode control signal from said next frequency-dividing unit, wherein said mode control signal indicates when to use said second factor, instead of said first factor in dividing said input clock, wherein the mode control signal received by the highest operative unit is fixed at a pre-defined logic level; and a logic unit coupled to receive said input signal, the mode control signal from said lowest unit and a resetting mode control signal, said logic unit designed to generate said output signal, wherein said logic unit generates transitions of said output signal from a first level to a second level coinciding with period-defining edges of said mode control signal from said lowest unit, wherein said logic unit generates transitions of said output signal from said second level to said first level coinciding with rising edges of said resetting mode control signal, wherein said divide ratio is at a first value in a first duration and a second value in a second duration, wherein said first value causes all of said frequency-dividing units to be operative for corresponding division operation, and wherein said second value causes one or more of said frequency-dividing units including said highest unit be non-operative for a corresponding division operation, wherein a mode control signal generated by only a same unit of said frequency dividing units is used as said resetting mode control signal in both of said first duration and said second duration.

2. The programmable frequency divider of claim 1, wherein units up to a third unit from said highest unit are required to be made non-operative for division with said divide ratio equaling said lowest limit, wherein said third unit is the highest operative unit operative when said divide ratio equals said lowest limit, wherein said same unit is said third unit.

3. The programmable frequency divider of claim 2, wherein at least two units are non-operative for division with said divide ratio equaling said lowest limit.

4. The programmable frequency divider of claim 1, wherein said first factor is 2, and said second factor is 3.

5. The programmable frequency divider of claim 1, wherein said logic unit comprises a flip-flop, wherein said mode control signal from the lowest unit is provided as input to said flip-flop, wherein said input clock is provided to the clock input of said flip-flop, and wherein said resetting mode control signal is provided to the asynchronous reset input of said flip-flop, the output of said flip-flop being said output signal.

6. The programmable frequency divider of claim 1, wherein said period-defining edges are falling edges of said mode control signal from said lowest unit, and wherein said resetting mode control signal is a mode control signal generated by the rightmost unit in said cascade that is never set to be non-operative in supporting a range from said lowest limit to said a highest limit.

7. A phase locked loop (PLL) comprising:
a phase frequency detector (PFD) to receive a reference frequency and a feedback frequency, said PFD to generate a first error signal and a second error signal, said first error signal and said error signal being representative of a phase difference between said reference frequency and said feedback frequency;

a charge pump coupled to receive each of said first error signal and said second error signal, and to generate a corresponding charge;

a low-pass filter (LPF) coupled to receive said charge, and to convert said charge into a voltage;

a voltage controlled oscillator (VCO) coupled to receive said voltage, and to generate an output signal; and a programmable frequency divider coupled to receive said output signal, and to divide a frequency of said output signal to generate said feedback frequency, wherein said programmable frequency divider comprises:
a divide input for receiving a divide ratio, wherein said divide ratio is representative of a number by which the frequency of said output signal is to be divided to generate said feedback frequency, wherein said divide ratio is between a lowest limit and a highest limit, said divide ratio being represented by a set of bits;

a cascade of M frequency-dividing units coupled in series, said cascade comprising a lowest unit and a highest unit with the remaining of the M units being disposed in series between said lowest unit and said highest unit, wherein the highest unit is the $M^{th}$ unit, and the lowest unit is the first unit in said cascade, said lowest unit being coupled to receive said output signal generated by said VCO, wherein the range of values by which the frequency of said input signal can be divided by said cascade depends on the number of frequency-dividing units of said cascade that are operative, whereby said range of values is a first range if N successive frequency-dividing units of said M units are operative, but a second range, not equal to said first range, if (N−1) frequency-dividing units are operative, wherein each frequency-dividing unit in said cascade comprises:
a first input for receiving an input clock;
a first output for providing an output clock to the next frequency-dividing unit in said cascade;
a second output for providing a mode control signal to a previous frequency-dividing unit of said cascade; and a second input for receiving a corresponding bit in said set of bits, said corresponding bit having a logic level depending on said divide ratio, wherein the logic value received at said second input determines whether the frequency-dividing unit divides by a first factor or a second factor;

a third input for receiving a mode control signal from said next frequency-dividing unit, wherein said mode control signal indicates when to use said second factor, instead of said first factor in dividing said input clock, wherein the mode control signal received by the highest operative unit is fixed at a pre-defined logic level; and a logic unit coupled to receive said output signal generated by said VCO, the mode control signal from said lowest unit and a resetting mode control signal, said logic unit designed to generate said feedback frequency, wherein said logic unit generates transitions of said feedback frequency from a first level to a second level coinciding with period-defining edges of said mode control signal from said lowest unit, wherein said logic unit generates transitions of said feedback frequency from said second level to said first level coinciding with rising edges of said resetting mode control signal, wherein said divide ratio is at a first value in a first duration and a second value in a second duration, wherein said first value causes all of said frequency-dividing units to be operative for corresponding division operation, and wherein said second value causes one or more of said frequency-dividing units including said highest unit to be non-operative for a corresponding division operation, wherein a mode control signal generated by only a same unit of said frequency dividing units is used as said resetting mode control signal in both of said first duration and said second duration.

8. The PLL of claim 7, wherein units up to a third unit from said highest unit are required to be made non-operative for division with said divide ratio equaling said lowest limit, wherein said third unit is the highest operative unit operative when said divide ratio equals said lowest limit, wherein said same unit is said third unit.

9. The PLL of claim 8, wherein at least two units are non-operative for division with said divide ratio equaling said lowest limit.

10. The PLL of claim 7, wherein said first factor is 2, and said second factor is 3.

11. The PLL of claim 7, wherein said logic unit comprises a flip-flop, wherein said mode control signal from the lowest unit is provided as input to said flip-flop, wherein said input clock is provided to the clock input of said flip-flop, and wherein said resetting mode control signal is provided to the asynchronous reset input of said flip-flop, the output of said flip-flop being said output signal.

12. The PLL of claim 7, wherein said period-defining edges are falling edges of said mode control signal from said lowest unit, and wherein said resetting mode control signal is a mode control signal generated by the rightmost unit in said cascade that is never set to be non-operative in supporting a range from said lowest limit to said a highest limit.

13. The PLL of claim 7, wherein said number by which said frequency of said output signal is to be divided to generate said feedback frequency contains an integer portion and a fractional portion, said PLL further comprising a delta-sigma modulator (DSM) to receive said fractional portion and to generate a sequence of numbers corresponding to said fractional portion, wherein, in each cycle of said reference frequency, said programmable frequency divider adds said integer portion to a corresponding number in said sequence of numbers to generate said set of bits representing said divide ratio for a corresponding divide cycle.

14. The PLL of claim 13, wherein said number by which said frequency of said output signal is to be divided to generate said feedback frequency is such that the corresponding sequence of numbers contains a first number in said first range and a second number in said second range.

* * * * *